(12) United States Patent
Kilger et al.

(10) Patent No.: US 7,354,797 B2
(45) Date of Patent: Apr. 8, 2008

(54) METHOD FOR PRODUCING A PLURALITY OF ELECTRONIC DEVICES

(75) Inventors: Thomas Kilger, Regenstauf (DE); Stefan Paulus, Zeitlarn (DE)

(73) Assignee: Infineon Technologies AG, Munich (DE)

( * ) Notice: Subject to any disclaimer, the term of this patent is extended or adjusted under 35 U.S.C. 154(b) by 131 days.

(21) Appl. No.: 11/415,051

(22) Filed: May 1, 2006

(65) Prior Publication Data

US 2006/0192285 A1 Aug. 31, 2006

Related U.S. Application Data

(62) Division of application No. 10/705,516, filed on Nov. 10, 2003, now Pat. No. 7,067,915.

(30) Foreign Application Priority Data

Nov. 8, 2002 (DE) ................................ 102 52 556

(51) Int. Cl.
*H01L 21/44* (2006.01)
*H01L 21/48* (2006.01)
(52) U.S. Cl. .................. 438/108; 438/106; 438/613
(58) Field of Classification Search ................ 438/106, 438/108, 109, 121, 411, 461, 611–614; 257/734, 257/735, 737, 738
See application file for complete search history.

(56) References Cited

U.S. PATENT DOCUMENTS

| 5,485,039 | A | 1/1996 | Fujita et al. |
| 5,550,403 | A | 8/1996 | Carichner |
| 6,093,584 | A | 7/2000 | Fjelstad |
| 6,403,460 | B1 * | 6/2002 | Lin ............................ 438/618 |
| 6,893,799 | B2 * | 5/2005 | Danovitch et al. .......... 257/738 |
| 6,936,532 | B2 * | 8/2005 | Sakaida ....................... 438/616 |
| 2002/0053467 | A1 | 5/2002 | Gebauer et al. |
| 2003/0102538 | A1 | 6/2003 | Paulus |

FOREIGN PATENT DOCUMENTS

| DE | 100 31 204 A1 | 1/2002 |
| DE | 100 45 534 A1 | 4/2002 |
| WO | WO 02/01634 A3 | 1/2002 |

* cited by examiner

*Primary Examiner*—Hung Vu
(74) *Attorney, Agent, or Firm*—Laurence A. Greenberg; Werner H. Stemer; Ralph E. Locher (57) ABSTRACT

An electronic device has external contact elements projecting from at least one external contact side of a plastic housing. The external contact elements have an internal section and an external section. The external section has an external contact region tapering away from the external contact side. An external contact element of this type improves the possibilities of a soldering connection to circuit carriers of superordinate circuits.

6 Claims, 7 Drawing Sheets

METHOD FOR PRODUCING A PLURALITY OF ELECTRONIC DEVICES

CROSS-REFERENCE TO RELATED APPLICATIONS

This is a division of application Ser. No. 10/705,516, filed Nov. 10, 2003 now U.S. Pat. No. 7,067,915; the application also claims the priority, under 35 U.S.C. §119, of German patent application DE 102 52 556.0, filed Nov. 8, 2002; the prior applications are herewith incorporated by reference in their entirety.

BACKGROUND OF THE INVENTION

Field of the Invention

The invention relates to a method for producing a plurality of electronic devices. Electronic devices of this type have a housing made of a plastic composition, the external contact elements being disposed in a distributed fashion on an external side of the housing.

Published, Non-Prosecuted German Patent Application DE 100 31 204 A1, corresponding to published U.S. patent application Ser. No. 2003102538 A1, discloses a leadframe for such a device with external contact elements. The devices are manufactured in large numbers and applied by their external contact elements to circuit carriers of superordinate circuits. To that end, the external contact elements are electrically and mechanically connected to corresponding contact pads of the circuit carrier via soldering connections. This connection is exposed to high thermomechanical loads, which may lead to fracture or tearing away of the connections.

SUMMARY OF THE INVENTION

It is accordingly an object of the invention to provide a method for producing a plurality of electronic devices that overcome the above-mentioned disadvantages of the prior art devices and methods of this general type, which reliably withstands elevated thermomechanical loads.

With the foregoing and other objects in view there is provided, in accordance with the invention, a method for producing a plurality of electronic devices having external contact elements. The method includes providing a metal plate having a plurality of device positions, and forming cutouts in a top side of the metal plate at the device positions. The contour of the cutouts corresponds to a form of external sections of the external contact elements. A mask is applied to the top side of the metal plate, the mask has openings formed therein in a region of the cutouts. At least one core material is deposited, via chemical deposition or electrodeposition, in the cutouts and in the openings resulting in the formation of metallic bulges at edges of the openings in the mask. A metallic material is applied to the metallic bulges and then the mask is removed. Semiconductor chips having contact areas are disposed at the device positions. The contact areas of the semiconductor chips are electrically connected to at least the metallic bulges. The metal plate is coated with a plastic housing composition resulting in a composite body being produced and the metal plate is then removed. The composite body is then separated into individual electronic devices.

The invention provides a method for producing a plurality of electronic devices with external contact elements. First, a metal plate with a plurality of device positions is provided. Cutouts are introduced into one of the top sides of the metal plate at the device positions, the contour of the cutouts corresponding to the form of external sections of the external contact elements. A mask is subsequently applied to the top side of the metal plate with openings being left free in the region of the cutouts. The mask serves for the chemical deposition or electrodeposition of at least one core material in the cutouts and in the openings of the mask resulting in the formation of a metallic bulge at the edges of the openings in the mask.

A metallic material may be applied to the bulges in order to enable bonding or soldering onto the bulges of the core material. Afterward, the mask is removed, and semiconductor chips are disposed at the device positions of the metal plate. Contact areas of the semiconductor chips are connected to the coated bulges. The metal plate is subsequently coated with a plastic housing composition, a composite body being produced. The components such as external contact elements and semiconductor chips of the device positions are embedded in the plastic housing composition of the composite body. The metal plate is subsequently removed, so that a panel containing a plastic housing composition and embedded components of the device positions remain. The external sections of the external contact elements project from the panel in each of the device positions. Finally, the composite body having the form of a panel is separated into individual electronic devices.

The method according to the invention has the advantage that, in each device position of the panel and thus after the separation of the composite body into individual electronic devices, external sections of external contact elements also project from each of the devices. Since the external sections of the external contact elements are produced together with internal sections of the external contact elements by a chemical deposition or electrodeposition process, stable external contact elements with an internal section and an external section form, thereby reducing the risk of fracture or tearing away of the external section from the internal section at high thermal loading.

The form of the external sections of the external contact elements that is achieved by the method according to the invention results in that shear forces that occur under thermomechanical loading at a boundary layer between a soldering connection and an external section of the external contact element can be distributed over a larger area. Shear forces that occur horizontally between the external contact elements of the electronic device and contact pads of a circuit carrier of a superordinate circuit are deflected by the angle between a horizontal and the external sections formed by the cutouts in the metal plate. In addition, the area between solder and solderable surface is enlarged compared with planar solderable surfaces by virtue of the external section of the external contact elements that is formed with the aid of the cutouts in the metal plate.

The introduction of cutouts into the top side of the metal plate in order to form the external sections of the external contact elements may be effected by an etching process, by milling, by embossing or by laser removal. In the case of an etching process for introducing the cutouts, first a covering mask is applied to the metal plate. The covering mask has openings through which an etching solution etches out cutouts from the metal plate. A covering mask of this type may subsequently be removed or initially be retained as a mask for a chemical deposition or electrodeposition of external contact elements. This reduces the number of method steps and simplifies the production of a plurality of an electronic device.

If the cutouts are introduced into the metal plate by an embossing tool or by a rolling tool, then the surface of the metal plate, except for the embossed cutouts, is to be provided with a protective layer prior to the chemical deposition or electrodeposition of external contact elements in the cutouts. A protective layer of this type is also applied if the cutouts are produced in the top side of the metal plate by laser removal or by milling.

For one development of the method, the chemical deposition or electrodeposition is carried out in two stages. In this case, in a first stage, a solder alloy is deposited as an external core material for the external section of the external contact elements in the cutouts and then a metal alloy is deposited as an internal core material having a higher melting point than the solder alloy for the internal sections of the external contact elements. The method has the advantage that the external core material already has a solder alloy that is already present for application of a finished electronic device to a circuit carrier of a superordinate circuit on the external section of each external contact element. The solder alloy may also be deposited in such a way that the individual metals forming the solder alloy are deposited as layers in the cutouts, the volume of the individual layers being in the same ratio to the total volume as the proportion of metal in the solder alloy.

The production of external contact elements can also be carried out in three stages. After deposition of the solder alloy in the cutouts of the metal plate, the metal plate is heated at least to above the flow limit of the solder alloy. After the solidification of the solder alloy in the cutout, an embossing punch is used to emboss the form of an external contact region into the soft solder alloy. Afterward, the pre-embossed external contact region and the internal section of the external contact element are electrodeposited, a metal alloy having a higher melting point than the solder alloy being deposited.

The chemical deposition or electrodepositon is continued until a rivet-head-type or mushroom-cap-type bulge is formed at each edge of an opening in the mask. Such a bulge may be formed from the core material of the internal section of the external contact element. However, the bulge may also have a material that is bondable or solderable, especially if the core material itself is composed of nickel, copper, silver, or the alloy thereof and so bonding or soldering directly on the core material does not appear to be possible. Such bondable or solderable bulges contain chemically deposited or electrodeposited gold, silver, aluminum or the alloys thereof.

Bondable internal coatings of a noble metal layer may additionally be deposited on bulges made of a core material, such as nickel or a nickel alloy, in order to realize corresponding bonding connections to semiconductor chips in the device positions. If semiconductor chips with flip-chip contacts are provided in the device positions, then solderable coatings are preferably deposited on the bulges.

Besides the openings in the mask for the chemical deposition or electrodeposition of external contact elements, additional structures may be provided in order to deposit conductor tracks and/or semiconductor chip islands on the top side of the metal plate. Such structures containing conductor tracks enable a rewiring proceeding from contact areas on the semiconductor chips to the external contact elements according to the invention.

Furthermore, semiconductor chips with flip-chip contacts may be provided and disposed at the device positions by their flip-chip contacts being chemically and electrically connected to the bulges. No additional structures in the form of conductor tracks are necessary in this case.

If semiconductor chips with contact areas on the active top sides of the semiconductor chips are provided for the electronic devices, then it is advantageous, for the rear sides of the semiconductor chips, to deposit chip islands on the metal plate and, before the application of a plastic housing composition, to connect the bulges of the external contact elements to the contact areas of the semiconductor chips via bonding wires.

The removal of the metal plate after the application of a plastic housing composition to the top side of the metal plate may be effected by etching. In order to ensure that such an etching process is stopped at the boundary layer with respect to the filling material of the cutouts, it is possible, before the cutouts are completely filled, to apply an etching stop layer as a boundary layer between the material for the external contact elements and the material of the metal plate. An etching stop layer of this type is not necessary if the filling material for the cutouts contains nickel or a nickel alloy and the metal plate is produced from copper, because it is possible in such a case to use a copper etching solution that has a reduced etching rate at the boundary transition with respect to nickel.

A further aspect of the invention is to provide an electronic device with a plastic housing and with external contact elements projecting from the plastic housing on at least one external contact side. An electronic device of this type has external contact elements that have an internal section with an internal core, the internal section being disposed in the plastic housing, and an internal coating. The internal section additionally has an anchoring region, which fixedly anchors the external contact element in the plastic housing. The external sections of the external contact elements that project from the external contact side of the plastic housing have an external core with an external coating. The external section has at least one external contact region tapering away from the external contact side.

An electronic device of this type has the advantage that the solderable surface is enlarged compared with planar external contact areas on account of the external contact regions. It is thus possible to produce a mechanically more reliable connection between an electronic device of this type and a circuit board with superordinate circuits. As already mentioned above, shear forces acting horizontally on account of thermomechanical loads are deflected at the external sections of the external contact elements, so that the special form of these external sections deposited in a cutout of a metal plate enables mechanically, more stable connections.

For large-area external contact elements, an individual external contact element may have an external section with a plurality of external contact regions that adjoin one another. The external contact regions are realized by cutouts adjoining one another in the above-mentioned metal plate. It is thus possible to achieve a soldering-intensive intermeshing with contact pads of a circuit carrier for superordinate circuits without the external sections of the large-area external contact elements projecting further from the external contact side than external sections of small-area external contact elements.

The external section of an external contact element may have at least one essentially conical or essentially pyramidal or essentially hemispherical external contact region. While hemispherical external contact regions can be realized by an etching process in the above-mentioned metal plate, an embossing or a laser removal is preferable for pyramidal or conical external contact regions. The conical or pyramidal external contact regions have the advantage that horizontal shear forces are deflected by a base angle between the horizontal and the boundary area of the special form of the external contact region and so the risk of fracture or tearing away of a soldering connection to a circuit carrier with a superordinate circuit is reduced. If a plurality of external contact regions in pyramidal or conical form are provided for large-area external contact elements, then a stress reducing structure is produced as a result of the large area being divided into small pyramids or small cones in conjunction with a reduction of the height of the external section.

Furthermore, external core and internal core may have an identical core material, for which nickel, copper, silver or alloys thereof are preferably used. A core material made of nickel, copper or alloys thereof has an internal coating in the region of the internal core, the internal coating being applied to a bulge of the chemically deposited or electrodeposited external contact element. The internal coating improves the bondability and/or the solderability of a bulge of the internal core of the external contact element.

The external core may have an external coating made of a solder alloy that is produced by chemical deposition or electrodeposition. To that end, it is advantageous that the internal core has a metal or a metal alloy having a higher melting point than the flow temperature of the solder alloy.

A further possibility of a configuration of the present invention may consist in the internal section of the external contact element having an internal flat conductor and the external section of the external contact element having an external flat conductor with emplaced external contact region, it being possible for the external contact region to be of pyramidal or conical or hemispherical shaped. In this case, it is possible to realize electronic devices which, compared with conventional external flat conductors, provide a larger soldering surface for connection to a superordinate circuit structure and thus enable an improved and more reliable soldering connection.

To summarize, it should be remarked that considerable loads occur at soldering points of a housing on account of mechanical and thermomechanical loading. The loads lead to fatigue of soldering points of superordinate circuit structures. In this case, on the basis of extensive investigations, the weakest point is not to be found in the soldering structure itself, rather the interface between solder and external contact area of the electronic device has proved to be extremely critical. By virtue of the present invention, on the one hand the stress is distributed better, and on the other hand horizontally acting shear forces are diverted in other directions.

The configuration of the external contact elements of the invention achieves an enlargement of the interface for the purpose of minimizing stress by prepatterning of a flat conductor frame or a top side of a metal plate. The diversion of the shear forces that act by a special pyramidal or conical form reduces the risk of fracture or tearing away of soldering connections between the device according to the invention and superordinate circuit structures. Furthermore, dividing up a large area of an external contact element between a plurality of pyramidal or conical forms which are strung together makes it possible to divide up the thermomechanical loads.

Other features which are considered as characteristic for the invention are set forth in the appended claims.

Although the invention is illustrated and described herein as embodied in a method for producing a plurality of electronic devices, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
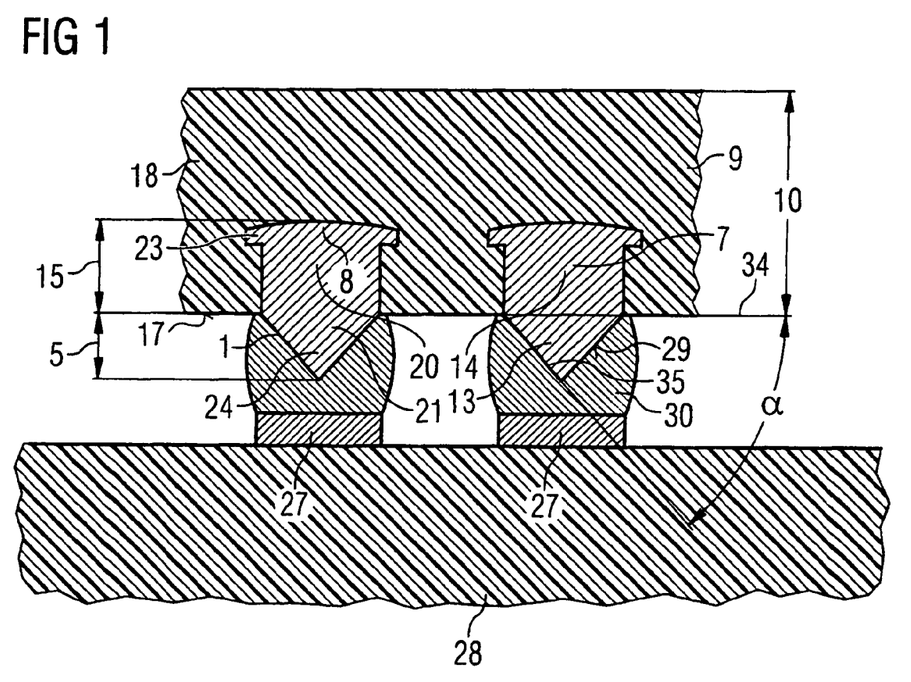
FIG. 1 is a diagrammatic, cross-sectional view through part of a device that is soldered by its external contact elements on contact pads of a circuit carrier.

Referring now to the figures of the drawing in detail and first, particularly, to FIG. 1 thereof, there is shown a diagrammatic, cross-sectional view through part of an electronic device having a plastic housing 18, which is soldered by its external contact elements 1 on contact pads 27 of a circuit carrier 28 of a superordinate electrical circuit. The external contact element 1 projects from an external contact area 17 of the electronic device and tapers in the direction away from the external contact area 17. The external contact element 1 has an internal section 15 and an external section 5. The internal section 15 has an internal core 20 having an internal core material 14. The external section 5 has an external core 21 having an external core material 13. Both sections 5 and 15 are constructed from an identical core material 7 in this embodiment of the invention. The internal section 15 has a rivet-head-type or mushroom-cap-type bulge 8 by which the external contact element 1 is anchored in a plastic housing composition 9. The external section 5 has an external contact region 24 that, in this embodiment of the invention, is of a conical configuration with a base angle α between a base line 34 and a generating line 35.

A drop of solder 30 provides a soldering connection 29 between an external contact region 24 of the external contact element 1 of the electronic device and the contact pad 27 of the circuit carrier 28. By virtue of the essentially conical shape of the external section 5, horizontal shear forces which occur under thermomechanical loading are deflected by the base angle α of the conical external contact region 24 of the external contact element 1 and, at the same time, the surface wetted with the soldering material is enlarged relative to the planar contact pad 27 by virtue of the shaping of the external contact region 24. Consequently, the risk of fracture of the external contact element 1 on account of thermomechanical loading is reduced, and a reinforced anchoring of the external contact elements 1 in the drop of solder 30 is ensured.

Figure 2:
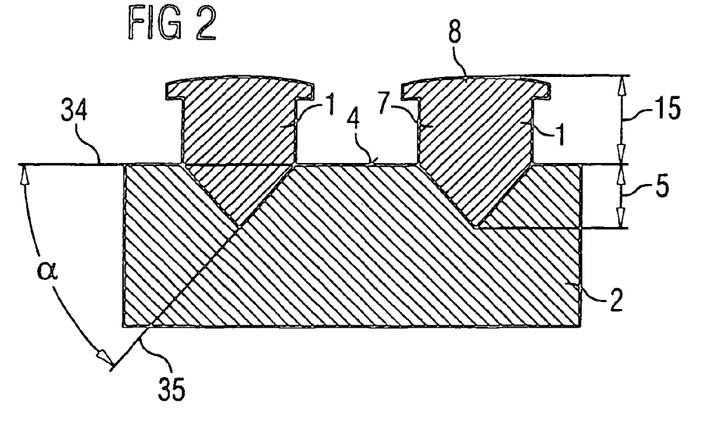
FIG. 2 is a diagrammatic, cross-sectional view through the external contact elements in accordance with a first embodiment of the invention before the external contact elements are embedded in a plastic housing composition.

FIG. 2 shows a diagrammatic, cross-sectional view through the external contact elements 1 in accordance with a first embodiment of the invention before the external contact elements 1 are embedded in the plastic housing composition 9. The particular shaping of the external contact elements 1 in FIG. 2 corresponds to the external contact elements in FIG. 1. The shaping of the external contact section 5 is achieved by introducing a cutout into a metal plate 2, which is composed of copper in this embodiment of the invention.

After the introduction of the cutout for the shaping of the external section 5 of the external contact elements 1, which, in this embodiment of the invention, was produced by an embossing tool, or by etching, or by laser removal or by milling, a top side 4 of the metal plate 2 is covered with a non-illustrated protective mask which only leaves free the cutouts for a deposition of the external section 5 of the external contact element 1. The particular form of the external contact element 1 arises in the course of filling the cutouts in the metal plate 2 and in the openings of the protective mask, a bulge 8 being achieved by virtue of the fact that the electrodeposition process is not terminated after openings in the mask have been filled, but rather is maintained for longer.

Figure 3:
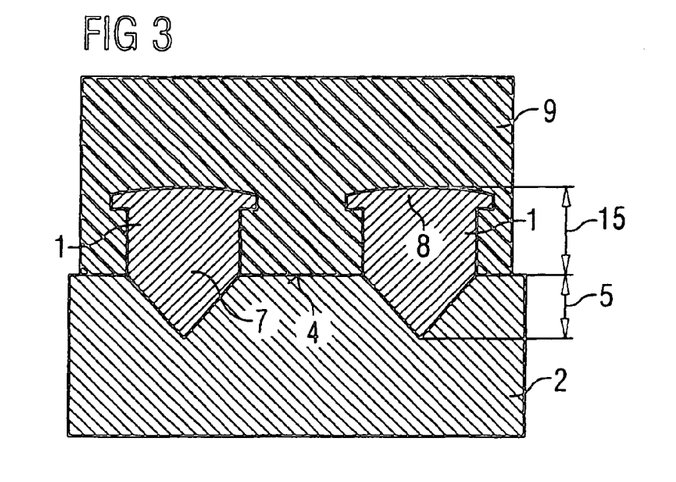
FIG. 3 is a diagrammatic, cross-sectional view through the external contact elements in accordance with FIG. 2, which are embedded in the plastic housing composition by their internal sections and in a metal plate by their external sections.

FIG. 3 shows a diagrammatic cross section through the external contact elements 1 in accordance with FIG. 2 that are embedded in the plastic housing composition 9 by the internal sections 15 and in the metal plate 2 by the external sections 5.

Before the application of the plastic housing composition 9, a bondable coating is applied to the external contact elements shown in FIG. 2 in order that the external contact elements 1, still before being embedded in the plastic housing composition 9 as is shown in FIG. 3, are connected to contact areas of a non-illustrated semiconductor chip via non-illustrated bonding wires. During the application of the plastic housing composition 9, the bonding connections and the semiconductor chips are simultaneously embedded in the plastics composition, thereby producing a composite body which is initially still supported by the metal plate 2.

Figure 4:
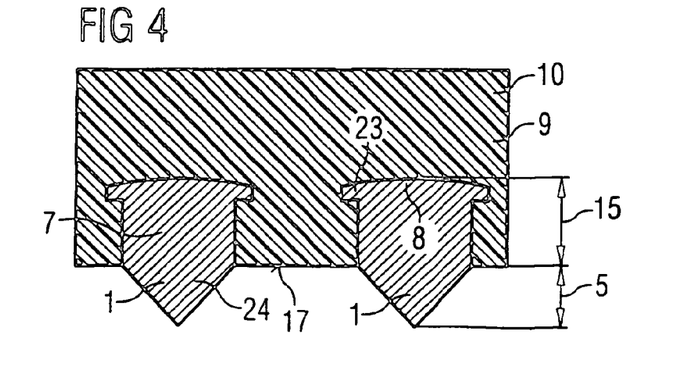
FIG. 4 is a diagrammatic, cross-sectional view through the external contact elements in accordance with FIG. 3 after the metal plate shown in FIG. 3 has been removed.

FIG. 4 shows a diagrammatic, cross-sectional view through the external contact elements 1 in accordance with FIG. 3 after the metal plate shown in FIG. 3 has been removed. The cross sectional view shown in FIG. 4 is already part of an electronic device obtained from the composite body as shown in FIG. 3. The bulge 8 of the internal section 15 of the external contact element 1 forms an anchoring region 23 within the plastic housing composition 9. The external contact section 5 exhibits identically patterned and formed external contact regions 24 for the two external contact elements 1 illustrated in FIG. 4.

Figure 5:
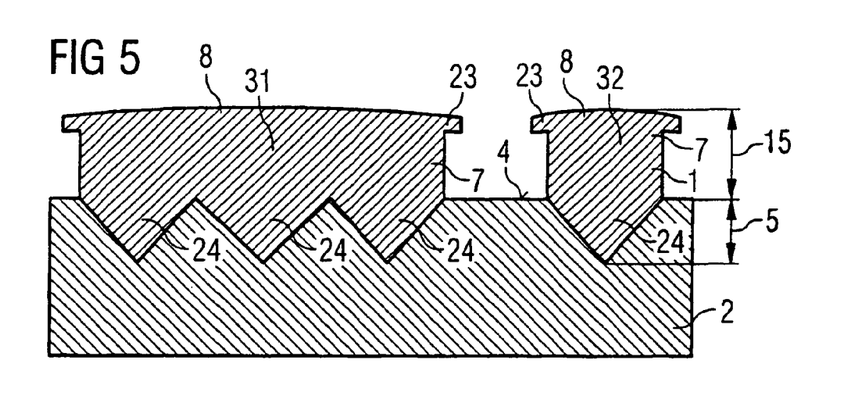
FIG. 5 is a diagrammatic, cross-sectional view through the external contact elements in accordance with a second embodiment of the invention before the external contact elements are embedded in the plastic housing composition.

FIG. 5 shows a diagrammatic, cross-sectional view through external contact elements 31 and 32 in accordance with a second embodiment of the invention before the external contact elements 31 and 32 are embedded in the plastic housing composition 9. In the second embodiment of the invention, a large-area external contact element 31 having a total of nine essentially pyramidal external contact regions 24 is prefabricated on the metal plate 2. An individual external contact element 32 with only one external contact region 24 is shown in cross section besides that. For the large-area external contact element 31, nine essentially pyramidal cutouts disposed adjacent beside one another are introduced into the metal plate 2, which cutouts have already been filled with a common core material in FIG. 5, a large-area internal section 15 also being formed for the external contact element 31 with the bulge 8 for the anchoring region 23. The external contact element 32 illustrated on the right-hand side in FIG. 5 does not differ from the external contact elements 1 shown previously in FIGS. 1 to 4.

Figure 6:
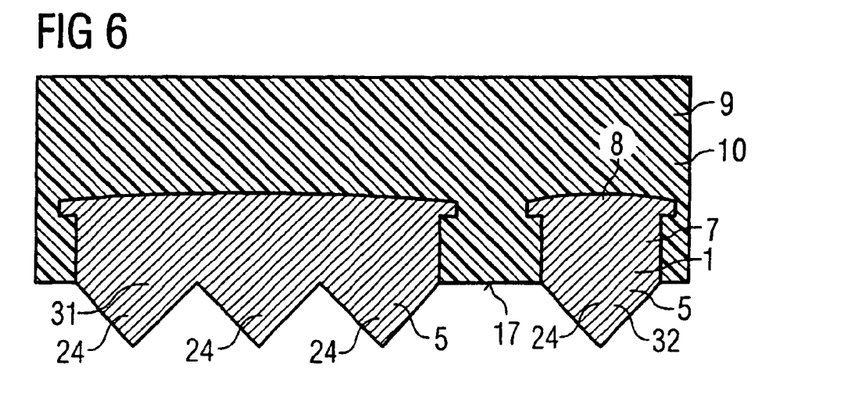
FIG. 6 is a diagrammatic, cross-sectional view through the external contact elements in accordance with FIG. 5 after an electronic device has been completed.

FIG. 6 shows a diagrammatic, cross-sectional view through an external contact element 31 and 32 in accordance with FIG. 5 after an electronic device has been completed. To that end, the external contact elements 31 and 32 are embedded in the plastic housing composition 9 and the metal plate 2 shown in FIG. 5 has already been removed, so that the external sections 5 project from the external contact side 17 of the electronic device 1.

Figure 7:
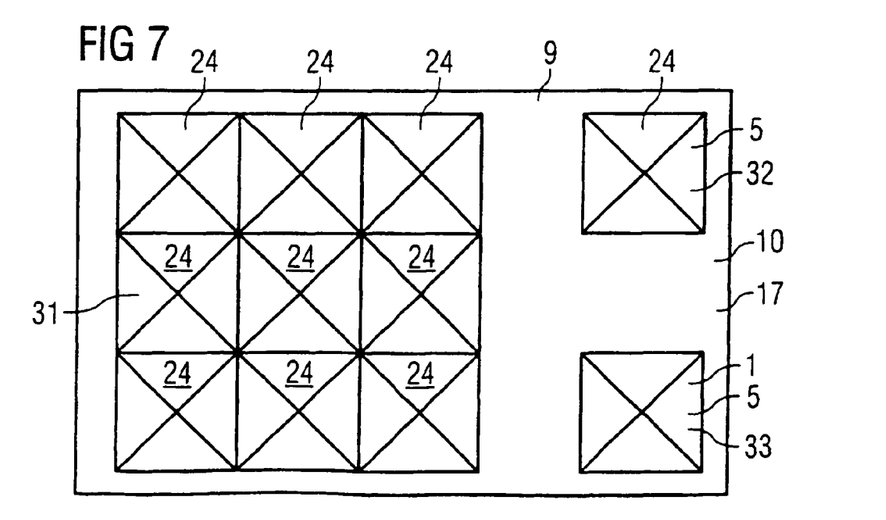
FIG. 7 is a diagrammatic, plan view of an external contact side of the electronic device in accordance with FIG. 6.

FIG. 7 shows a diagrammatic, plan view of the external contact side 17 of the electronic device in accordance with FIG. 6. The black region in FIG. 7 shows the plastic housing composition 9, while the light regions show the external contact sections 5 with their external contact regions 24. The pyramidal shape of the external contact regions 24 is particularly pronounced in the second embodiment of the invention. For a large-area external contact element 31, nine pyramidal external contact regions 24 are strung together, the electronic device represented here having two further external contact elements 32 and 33 whose size corresponds approximately to that of the external contact elements 1 previously shown in FIGS. 1 to 4.

Figure 8:
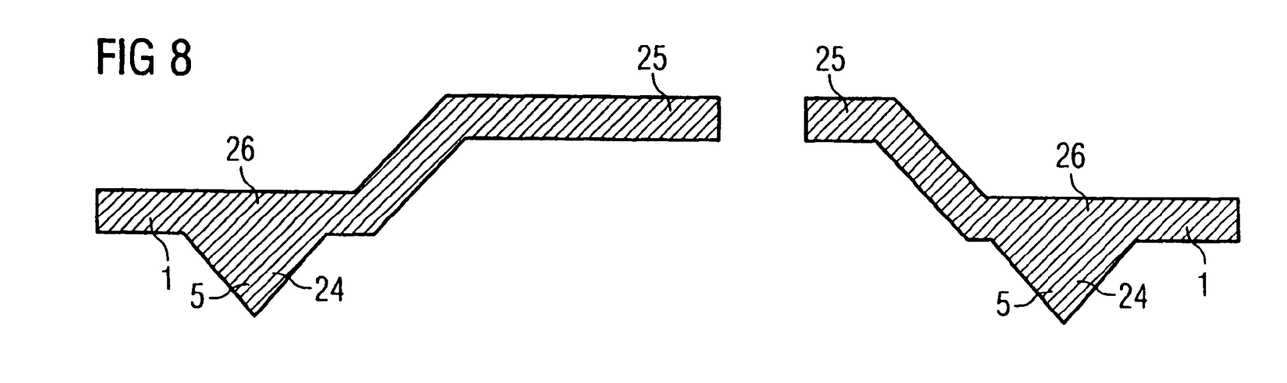
FIG. 8 is a diagrammatic, cross-sectional view of a flat conductor frame with external and internal flat conductors and external contact regions emplaced on the external flat conductors.

FIG. 8 shows a diagrammatic, cross-sectional view of part of a flat conductor frame with external flat conductors 26 and internal flat conductors 25, external contact regions 24 being emplaced on the external flat conductors 26. The emplacement of the external contact regions 24 on the external flat conductors 26 may be effected by printing technologies, in particular screen printing technology, or be achieved by chemical deposition or electrodeposition. The effect of the external contact regions 24 on the external flat conductors 26 corresponds to the effect that has already been given for the first and second embodiments of the invention. The particular shaping of the emplaced external contact regions 24 enables more reliable soldering and connection to contact areas of a circuit carrier of a superordinate circuit.

Figure 9:
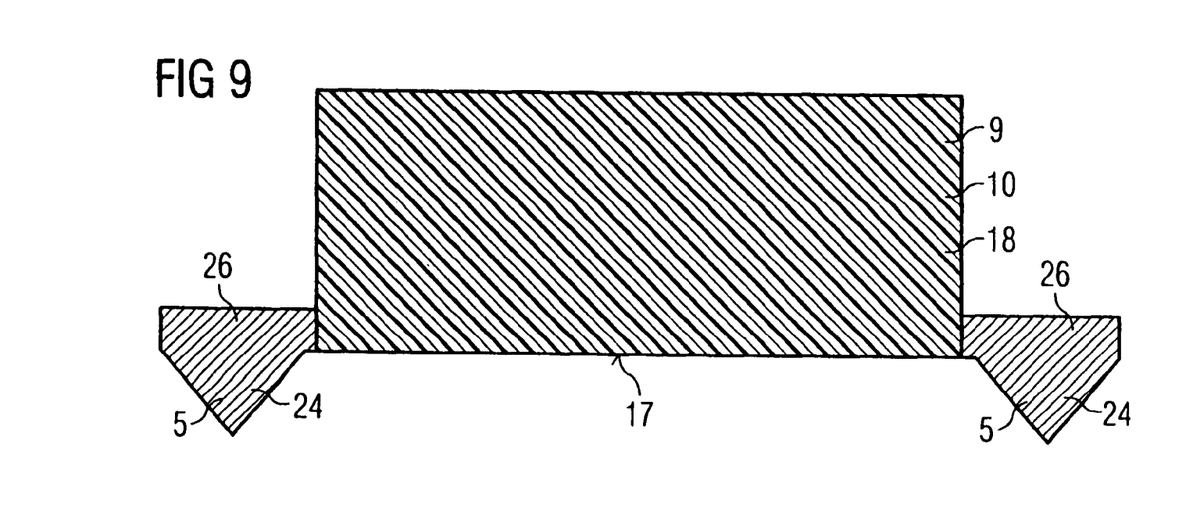
FIG. 9 is a diagrammatic, cross-sectional view of the flat conductor frame in accordance with FIG. 8 after an electronic device has been completed.

FIG. 9 shows a diagrammatic, cross-sectional view of the part of the flat conductor frame in accordance with FIG. 8 after an electronic device has been completed. In the third embodiment of the invention, the external flat conductors 26 project laterally from the plastic housing composition 9, while the external contact regions 24 provided on the external flat conductors 26 extend with a tapering cross section from the external contact side 17.

FIGS. 10 to 16 illustrate method steps which lead to an electronic device with the external contact elements 1, the external contact section 5 essentially having the form of a spherical cap or a dome. Furthermore, the external section 5 and the internal section 15 are formed of different materials. An electronic device with the external contact elements 1 of this type has the advantage that, for repair work, a device of this type already has a solder deposit if the external section of the external contact element 1 at least partially has a soldering material. Consequently, during the repair process, it is not necessary to apply additional solder to external contacts by a punch or screen printing method before the use of a device of this type.

Figure 10:
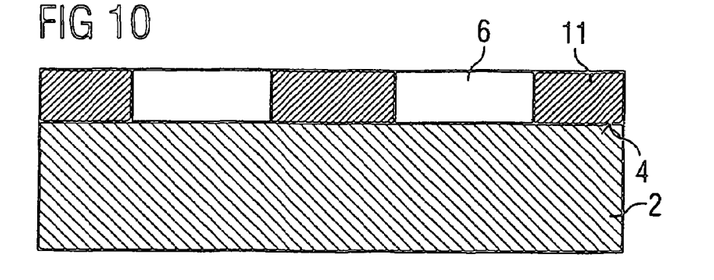
FIG. 10 is a diagrammatic, cross-sectional view of a metal plate with an overlying covering mask.

FIG. 10 shows a diagrammatic, cross-sectional view of the metal plate 2 with an overlying covering mask 11. Using a covering mask 11 of this type, depressions are introduced into the surface 4 of the metal plate 2 at the locations that have an opening 6 in the covering mask 11. In this case, the form of the depressions can be controlled by way of the geometry of the covering mask 11, the nature of an etching medium and the parameters of an etching process. A suitable form of the depressions can also be achieved by laser removal, by embossing or by milling.

Figure 11:
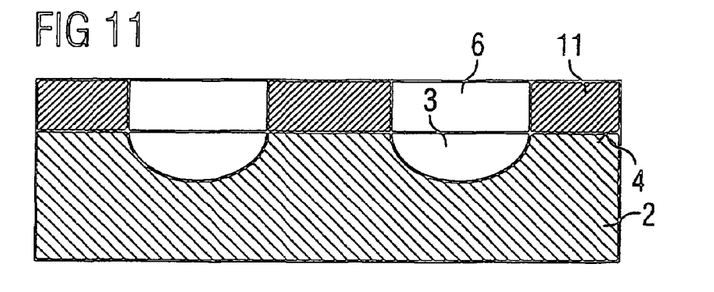
FIG. 11 is a diagrammatic, cross-sectional view of the metal plate in accordance with FIG. 10 after cutouts have been etched into the top side of the metal plate.

FIG. 11 shows a diagrammatic, cross-sectional view of the metal plate 2 in accordance with FIG. 10 after cutouts 3 have been etched into the top side 4 of the metal plate 2. The metal plate 2 contains copper or copper alloys and is dipped into a copper etching solution in order to etch out the cutouts 3.

Figure 12:
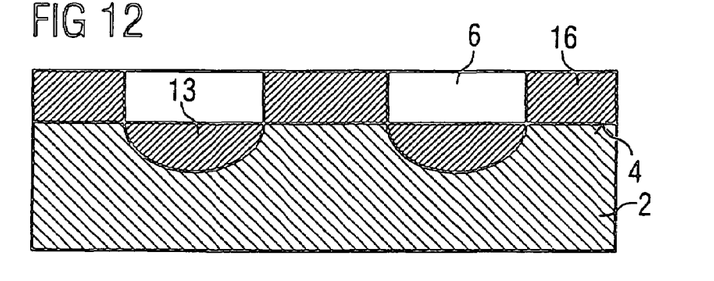
FIG. 12 is a diagrammatic, cross-sectional view of the metal plate in accordance with FIG. 11 after the cutouts in the metal plate have been filled through openings in a covering mask.

FIG. 12 shows a diagrammatic cross section of the metal plate 2 in accordance with FIG. 11 after the cutouts 3 have been filled through the openings 6 in a protective mask 16 for an electrodeposition. In FIG. 12, the cutouts are filled with a solder alloy effected by soldering paste printing, soldering paste dispensing, population with solder balls, chemical deposition of the solder or electrodeposition of the solder. In order that the cutouts 3 are filled with solder completely and uniformly, it is possible in addition to perform a remelting process in which the metal plate 2 is heated to the flow temperature of the solder.

Figure 13:
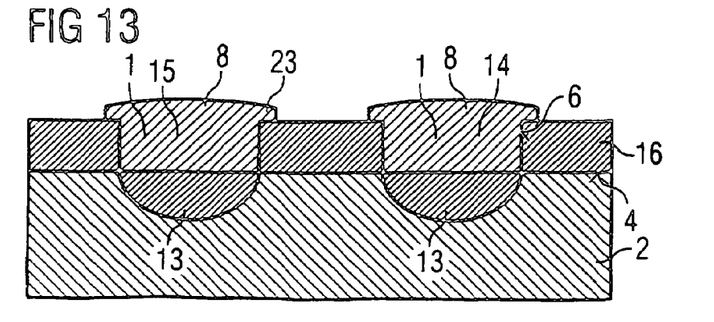
FIG. 13 is a diagrammatic, cross-sectional view of the metal plate of FIG. 12 after openings in the covering mask have been filled.

FIG. 13 shows a diagrammatic, cross-sectional view of the metal plate of FIG. 12 after the openings 6 have been filled in the protective mask 16. To that end, a material is deposited in the openings 6 of the protective mask 16, the material having a melting point that lies above the flow point of the soldering material of the solder deposit shown in FIG. 12. The electrodeposition is carried out until the bulge 8 forms over the edge regions of the openings 6 in the protective mask 16. The bulges 8, which form in a mushroom cap fashion or rivet head fashion during the electrodeposition, anchor the external contact elements 1 shown in FIG. 13 in the plastic housing composition 9 of an electronic device.

Figure 14:
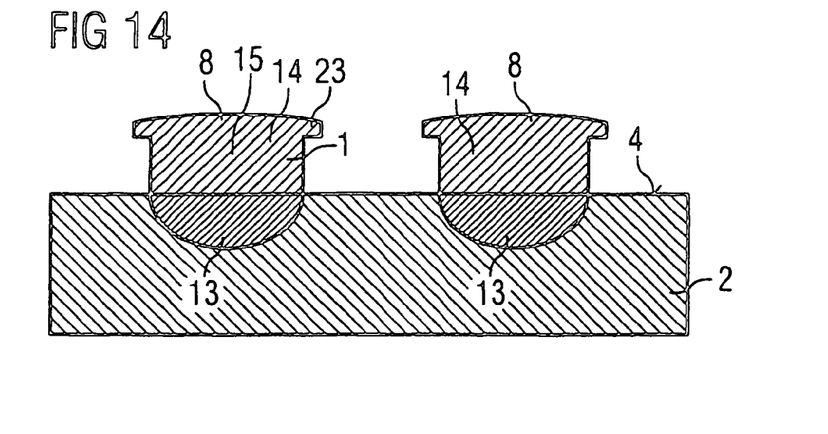
FIG. 14 is a diagrammatic, cross-sectional view through the metal plate in accordance with FIG. 13 after the protective mask shown in FIG. 12 has been removed.

FIG. 14 shows a diagrammatic, cross-sectional view through the metal plate 2 in accordance with FIG. 13 after the removal of the protective mask 16 shown in FIG. 12. After the removal of the protective mask 16, the external contact elements 1 project from the metal plate 2, the projecting regions forming internal sections of external contact elements 1, and the fillings of cutouts of the metal plate 2 forming the external sections of the external contact elements 1.

Figure 15:
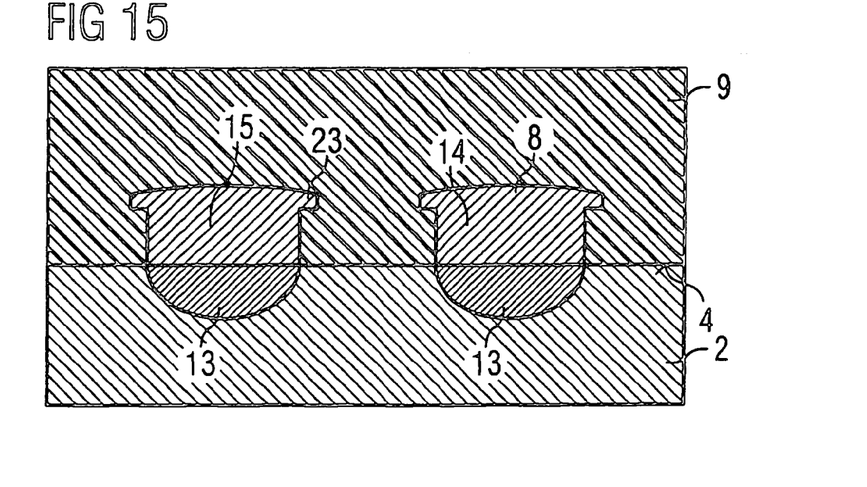
FIG. 15 is a diagrammatic, cross-sectional view through the metal plate in accordance with FIG. 14 after a plastic composition has been applied to the metal plate.

FIG. 15 shows a diagrammatic, cross-sectional view through the metal plate 2 in accordance with FIG. 14 after the plastic housing composition 9 has been applied to the metal plate 2. In this case, the internal sections of the external contact elements 1 are completely embedded in plastic housing composition 9 and anchored in the plastic composition on account of the bulges 8.

Figure 16:
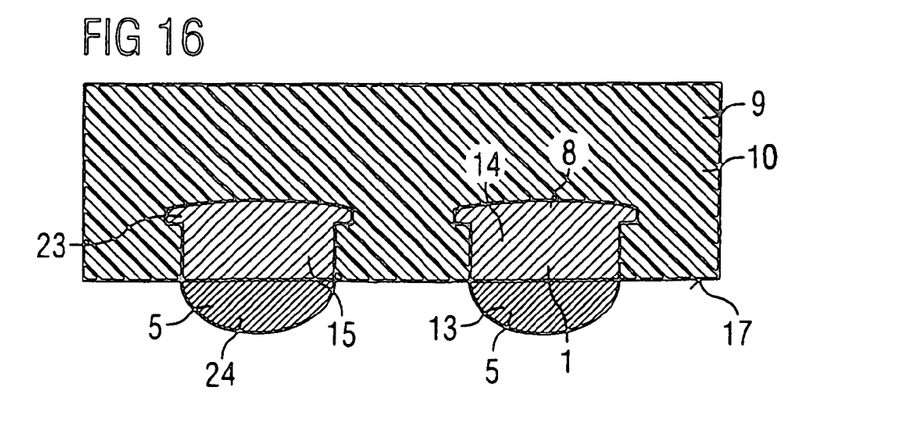
FIG. 16 is a diagrammatic, cross-sectional view through a composite body after the metal plate shown in FIG. 15 has been removed.

FIG. 16 shows a diagrammatic, cross-sectional view through a composite body after the removal of the metal plate 2 shown in FIG. 15. The composite body has non-illustrated semiconductor chips and techniques of connection (not shown) to the external contact elements 1. Consequently, FIG. 16 merely shows a detail or part of such a composite body with the external contact elements 1 having, as the external sections 5, a solder deposit connected to the internal section 15. The material of the internal section 15 is a nickel alloy in this embodiment of the invention. In order to uncover the external sections 5 of the external contact elements 1, the metal plate 2 shown in FIG. 15 has been etched away. Such a composite body, part of which is shown in FIG. 16, has a plurality of device positions and can be separated into individual electronic devices after the etching away of the metal plate 2 as shown in FIG. 15.

FIGS. 17 to 20 show method steps in which the advantages of forming a solder deposit as the external section 5 of an external contact element 1 are combined with the advantages of a pyramidal or conical shape of the external section 5 of the external contact element 1.

Figure 17:
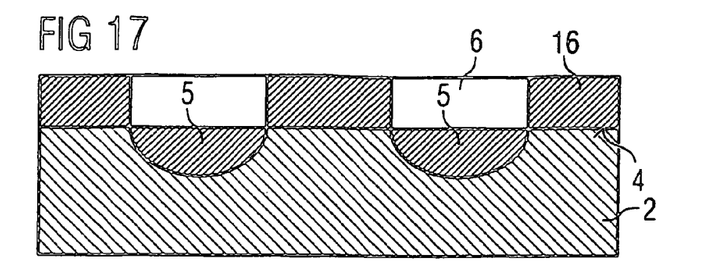
FIG. 17 is a diagrammatic, cross-sectional view of the metal plate with the cutouts filled with soldering material.

FIG. 17 shows a diagrammatic, cross-sectional view of the metal plate 2 with cutouts filled with soldering material as has already been shown in FIG. 12. This is the initial state of the metal plate 2 for the subsequent steps.

Figure 18:
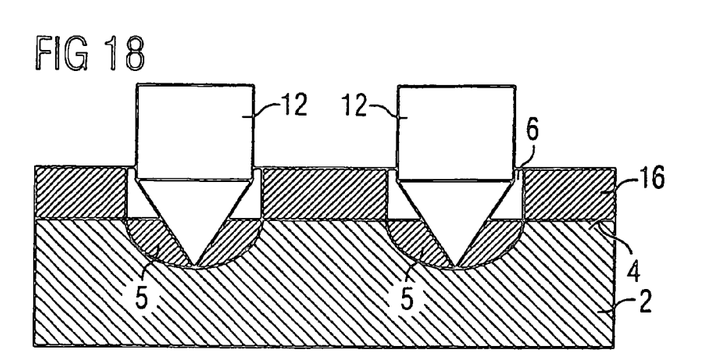
FIG. 18 is a diagrammatic, cross-sectional view of the metal plate in accordance with FIG. 17 and an embossing tool in each of the filled cutouts of the metal plate.

FIG. 18 shows a diagrammatic, cross-sectional view of the metal plate 2 in accordance with FIG. 17 and an embossing tool 12 in each of the filled cutouts 3 of the metal plate 2. Such an embossing tool 12 has a plurality of pyramidal tips that make an impression in the external sections 5 made of the soldering material with the aid of the embossing punch.

Figure 19:
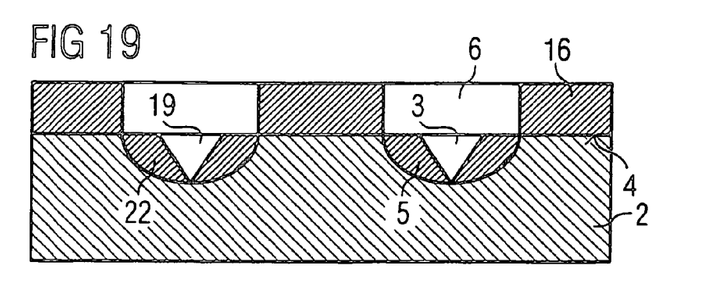
FIG. 19 is a diagrammatic, cross-sectional view of the metal plate in accordance with FIG. 18 after the removal of the embossing tool.

FIG. 19 shows a diagrammatic, cross-sectional view of the metal plate 2 in accordance with FIG. 18 after the removal of the embossing tool 12. A pyramidal impression remains in the external section 5 made of the soldering material and is filled with a nickel alloy by electrodeposition.

Figure 20:
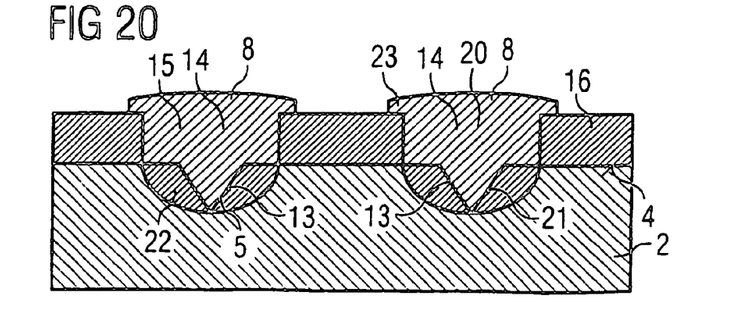
FIG. 20 is a diagrammatic, cross-sectional view of the metal plate in accordance with FIG. 19 after the filling of the cutout in the metal plate prior to removal of a protective mask.

FIG. 20 shows a diagrammatic, cross-sectional view of the metal plate 2 in accordance with FIG. 19 after the filling of the cutouts in the metal plate 2 and the openings 6 in the protective layer 16. For filling purposes, the nickel alloy is deposited, which not only forms the core material of the internal section 15 but also permits a pyramidal extension to project into the soldering material of the external section 5. With the external contact elements 1 configured in this way, it is possible to realize an electronic device having external sections that have an external core material 13 having a higher melting point than a surrounding soldering material in the external section 5.

We claim:

1. A method for producing a plurality of electronic devices having external contact elements, which comprises the steps of:

provide a metal plate having a plurality of device positions;

forming cutouts in a top side of the metal plate at the device positions, a contour of the cutouts corresponding to a form of external sections of the external contact elements;

applying a mask to the top side of the metal plate, the mask having openings formed therein in a region of the cutouts;

depositing, via one of chemical deposition and electrodeposition, at least one core material in the cutouts and in the openings resulting in a formation of metallic bulges at edges of the openings in the mask;

applying a metallic material to the metallic bulges;

removing the mask;

disposing semiconductor chips having contact areas at the device positions;

electrically connecting the contact areas of the semiconductor chips to at least the metallic bulges;

coating the metal plate with a plastic housing composition resulting in a composite body being produced;

removing the metal plate; and separating the composite body into individual ones of the electronic devices.

2. The method according to claim 1, which further comprises:

applying a covering mask to the metal plate as the mask; and etching the metal plate, through the openings of the covering mask, for forming the cutouts, the covering mask is subsequently used as a protective mask for the chemical deposition or the electrodeposition of the metallic bulges.

3. The method according to claim 1, which further comprises forming the cutouts in the metal plate using one of an embossing tool and a rolling tool.

4. The method according to claim 1, which further comprises carrying out the chemical deposition or the electrodeposition in two stages including the steps of:

depositing a solder alloy as an external core material for the external sections of the external contact elements; and depositing a metal alloy as an internal core material, having a higher melting point than the solder alloy, for internal sections of the external contact elements.

5. The method according to claim 1, which further comprises continuing the chemical deposition or the electrodeposition until the metallic bulges are rivet-head-type bulges or mushroom-cap-type bulges formed at the edges of the openings of the mask.

6. The method according to claim 1, which further comprises:

providing additional patterned openings in the mask for the chemical deposition or the electrodeposition at the device positions; and depositing at least one of conductor tracks and semiconductor chip islands in the openings.

* * * * *